United States Patent [19]

Vancelette et al.

[11] 4,422,232
[45] Dec. 27, 1983

[54] ELECTRONIC COMPONENT INSERTION MACHINE

[75] Inventors: Stanley R. Vancelette, Manchester, N.H.; Robert D. DiNozzi, Marblehead, Mass.; Mark V. Pierson, Binghamton, N.Y.

[73] Assignee: USM Corporation, Farmington, Conn.

[21] Appl. No.: 203,562

[22] Filed: Nov. 5, 1980

[51] Int. Cl.³ .............................................. H05K 3/30
[52] U.S. Cl. ..................................... 29/564.2; 29/741; 29/759; 29/837
[58] Field of Search ................... 29/741, 33 K, 564.6, 29/564.2, 564.7, 739, 759, 563, 835, 836, 837

[56] References Cited

U.S. PATENT DOCUMENTS

| | | | |
|---|---|---|---|
| 3,545,064 | 12/1970 | Zemek et al. | 29/741 X |
| 3,550,238 | 12/1970 | Allen et al. | 29/564.1 X |
| 4,030,180 | 6/1977 | Pierson | 29/741 |
| 4,063,347 | 12/1977 | Woodman, Jr. | 29/564.1 |
| 4,069,579 | 1/1978 | Liu | 29/741 X |
| 4,161,064 | 7/1979 | Woodman, Jr. et al. | 29/741 |
| 4,202,092 | 5/1980 | Shibasaki et al. | 29/741 |
| 4,222,166 | 9/1980 | Kurek et al. | 29/741 X |
| 4,320,574 | 3/1982 | Harigane et al. | 29/741 |

Primary Examiner—Z. R. Bilinsky
Attorney, Agent, or Firm—Alan N. McCartney

[57] ABSTRACT

An insertion device for two or four pin dual in-line electronic insertion machines which include a radial array of transfer units associated with a picker unit which grasps a component and inserts it into a circuit board.

14 Claims, 6 Drawing Figures

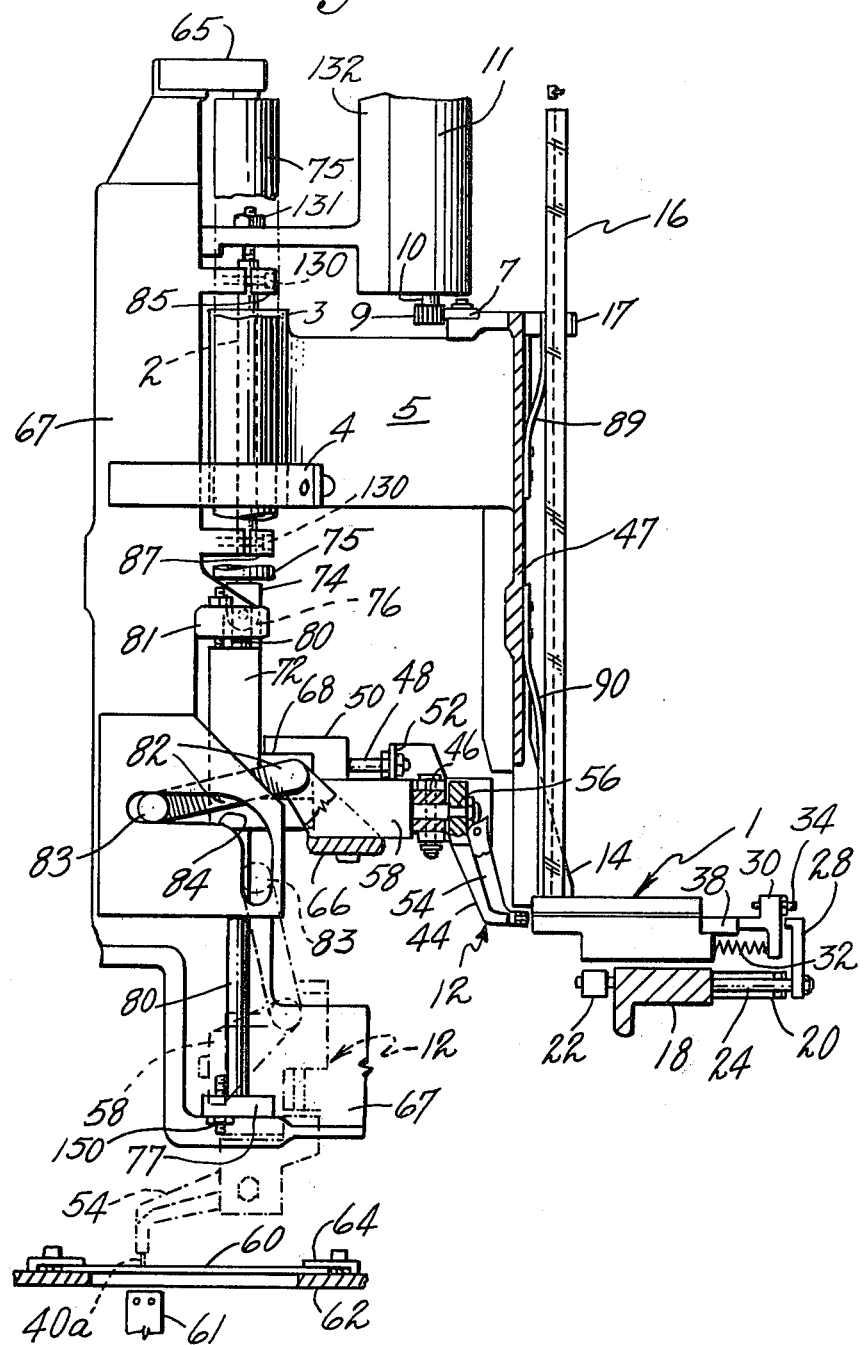

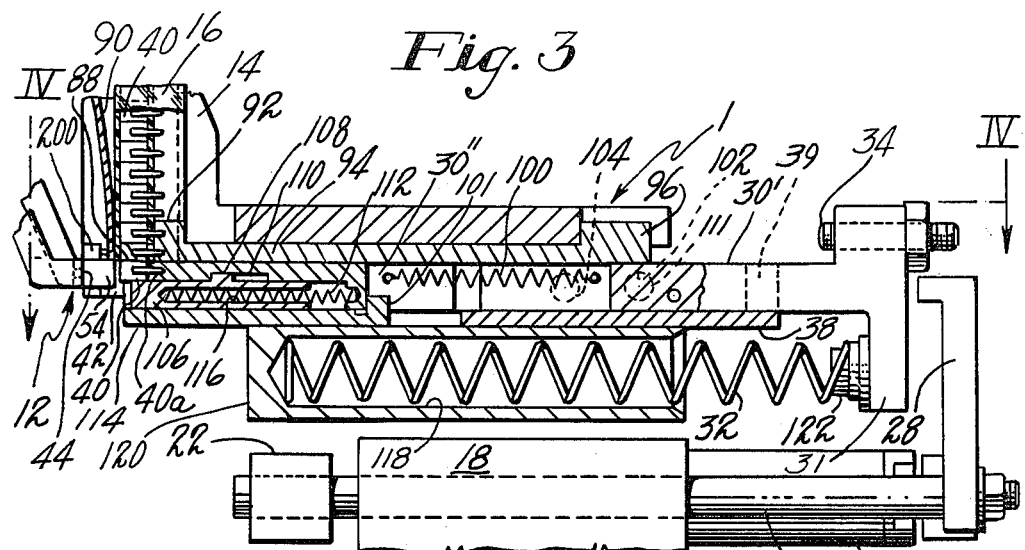
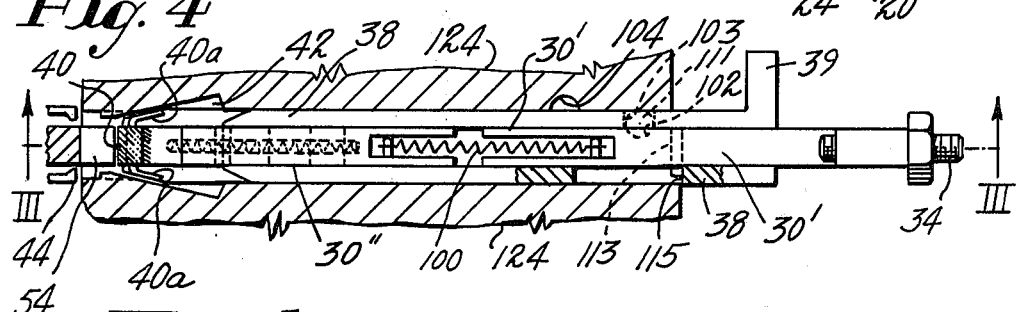
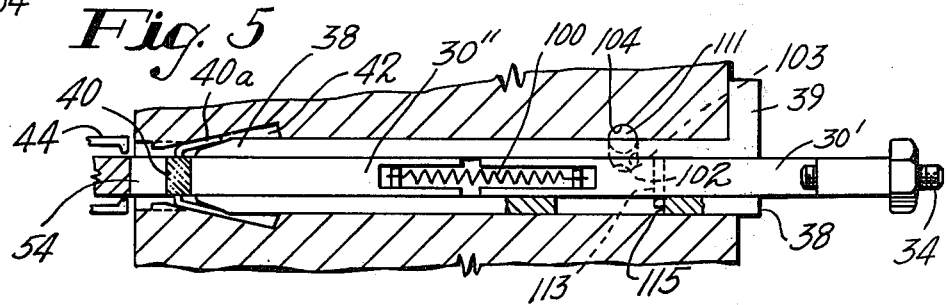
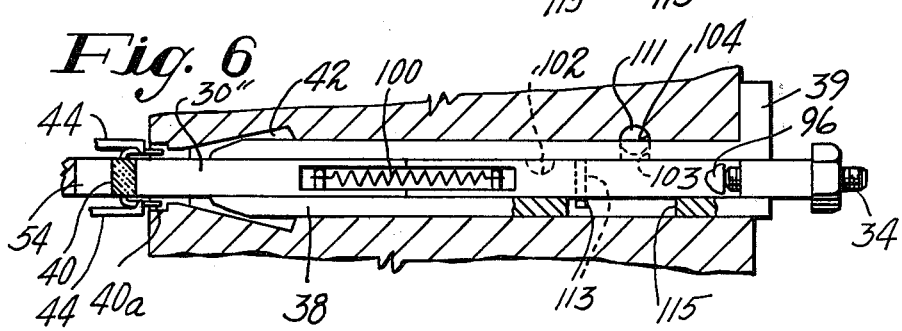

ELECTRONIC COMPONENT INSERTION MACHINE

BACKGROUND OF THE INVENTION

1. Field of the Invention

The present invention relates to electronic component insertion equipment and particularly to a feed mechanism for insertion of components having a body and dual in-line parallel leads extending therefrom, especially those with two or four leads.

2. Description of the Prior Art

Insertion machines for dual in-line electronic components have generally provided equipment that is reciprocated between a first position where the component is received and a second position where the component is inserted into a circuit board. Examples of such equipment is the U.S. Pat. No. 3,545,064 issued to Albert W. Zemak et al on Dec. 8, 1970, entitled Variable Size Module Sequence and Insertion Apparatus. Equipment which utilizes fingers to move the components from a supply to an insertion position is disclosed in the U.S. Pat. No. 4,030,180 issued to Mark V. Pierson, on June 21, 1977, entitled Longitudinally Fed Component Insertion Apparatus. With such equipment, each head assigns a particular type of dual in-line component. When two or four lead components are used, channels on one side of the machine are supplied with these components while those on the other side are supplied with larger ones. A shuttle is used to transport the components from a selected channel to the insertion head as the user's program dictates.

Components that are used with insertion machines are usually supplied to the industry in hollow plastic sticks which are placed into a receiver on the device. Such sticks are not loaded directly in the vertical position because the components frequently topple before dropping into the receiver. To prevent this problem, the receiver is swiveled forward into a horizontal position, a stick of components is loaded and a ram rod is used to push them to the bottom before it is swiveled back to the vertical. The use of a ram rod is cumbersome and the components sometime topple in spite of care on the part of the operator. Also the components can snag within the stick especially when it is being moved from the horizontal to the vertical.

SUMMARY OF THE INVENTION

According to the present invention, we have developed an automatic insertion machine for two and four lead dual in-line electronic components to insert these components into printed circuit boards. Our machine is designed to be a "bolt-on" attachment to a conventional dual in-line insertion machine which is used to insert components having more than two or four leads. The insertion machine of our invention utilizes standardized plastic tube packaging for delivery of the components to the head.

The machine which constitutes our invention is especially suitable for insertion of components having a body with two or four dual in-line parallel leads extending therefrom. The machine includes a radial array of rotatably arranged transfer units, each transfer unit having a magazine disposed at one end thereof and an associated means for retaining a component supply, the components being disposed in a predetermined orientation in hollow plastic sticks. Each stick may contain a different type of component. The retaining means is arranged so that the stick is disposed above the magazine whereby the components can drop into the magazine, one at a time. The transfer unit also includes a former and an ejector which are disposed in the transfer unit. The former is arranged to move into the magazine and spread the leads of the component towards the side wall. The ejector is arranged to force the components toward a picker mechanism and past the side walls of the magazine. As the ejector moves through the magazine to expel a component, its upper surface passes beneath the stick and prevents the next component from entering the magazine. A driver is arranged external to the transfer units to urge the former and ejector through the magazine and into a picker unit. A mechanism is utilized for indexing the individual transfer units with their respective component supplies into a position in front of the picker. The picker includes a pusher which is arranged to enter the transfer unit to engage a component to aid in the forming of the component and moving it from the transfer unit to the picker. The picker is then moved from the position in front of the transfer unit to a position over a table for insertion of the component into a circuit board.

DESCRIPTION OF THE DRAWINGS

FIG. 2 is a side elevational view of the transfer unit and picker assembly showing the picker assembly in two locations relative to the circuit board.

FIG. 3 is an enlarged side elevational view taken along the line III—III of FIG. 4, partially in cross section, showing the mechanism of the transfer unit.

FIGS. 4 to 6 are progressive cross sectional views of the top of the transfer unit taken along the line IV—IV of FIG. 3 showing the positions of the various components in various stages of transfer.

DESCRIPTION OF THE PREFERRED EMBODIMENT

Figure 1:
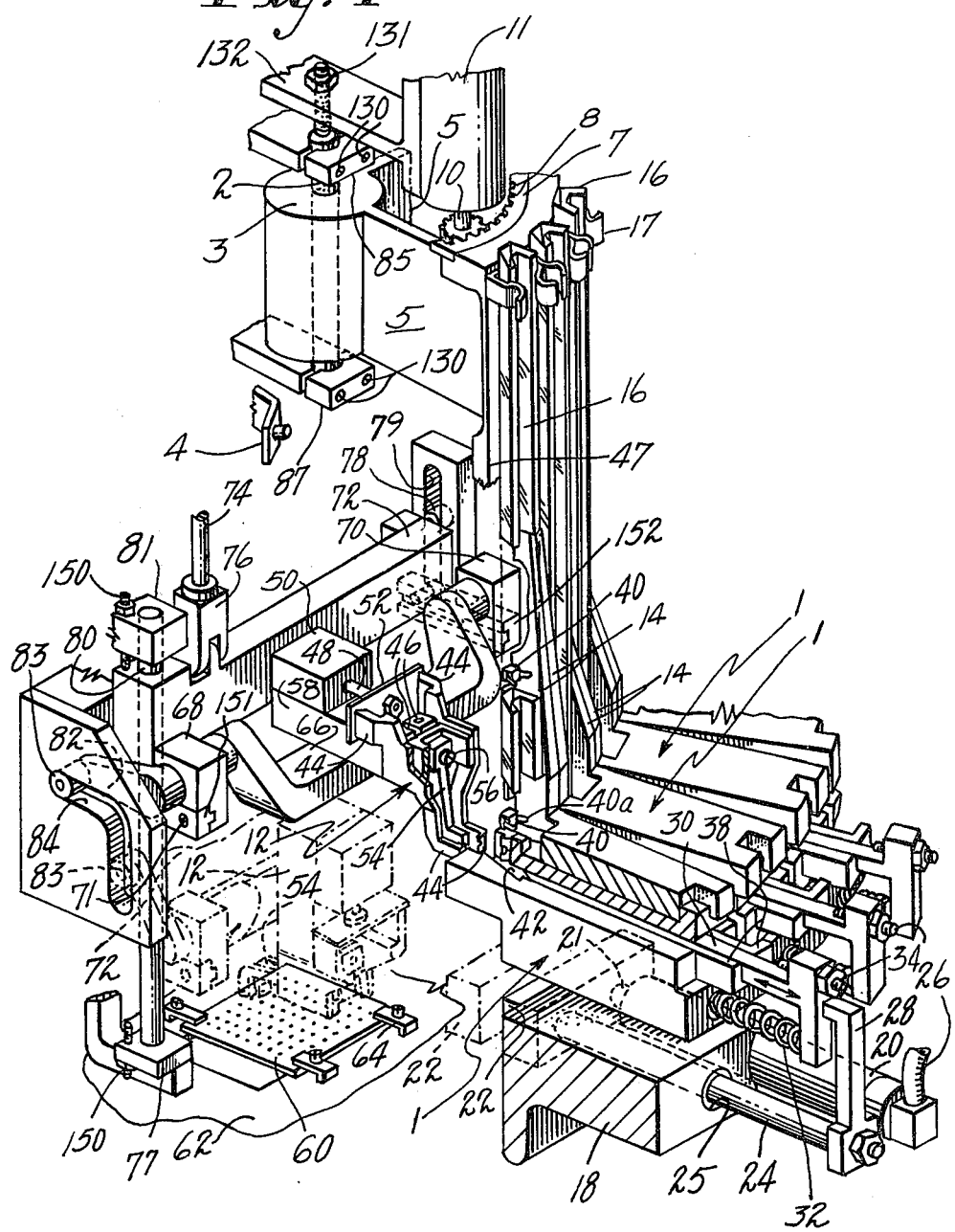
FIG. 1 is a perspective view of the machine showing the transfer unit and the picker assembly. A phantom portion shows the picker assembly in the insertion position over a circuit board.

Referring now to FIG. 1 of the drawing, the machine includes a plurality of radially arranged transfer units 1 which are secured to each other and revolve on a hub 3 about a shaft 2. Shaft 2, in turn, is attached to a conventional dual in-line component inserter which is designed to handle components having more than two or four leads. Two radially disposed supports 5 hold a gear track 7 with teeth 8. A pinion 9 is supported on shaft 10 and is driven by a servo-motor 11. The transfer units 1 will rotate and one of them will be located in an appropriate position in front of a picker 12 as directed by the servo-motor 11, supported on bracket 132 as shown in FIG. 2. The location of the transfer units 1 on the vertical axis can be adjusted relative to the picker assembly 12 by loosening set screws 130 and then tightening or loosening nut 131 which abuts bracket 132 whereby the entire shaft 2 will be drawn up relative to brackets 85 and 87. When the desired location of transfer units 1 on the vertical axis is established, set screws 130 are tightened and shaft 2 is fixedly disposed. The servo-motor 11 is designed to be responsive to the commands of a programmed source (not shown) and will rotate a predetermined number of turns, or part thereof, so as to dispose a particular transfer unit in front of the picker 12 whereby a particular component can be dispensed. A stop 4 is fixedly attached to the conventional component inserter and is arranged to engage support 5 to limit the rotational travel of the assembly of transfer units. Transfer units 1 are fixedly attached to a transfer unit-support 5 by means of struts 14 and radial wall 47 which serve both as the support for the transfer units and also to support hollow plastic sticks 16 that contain supplies of the dual in-line components. Sticks 16 are held between struts 14 by spring clips 17.

The transfer units 1 are disposed over a lower frame 18 that can be fixedly attached to the main frame of the conventional inserter. The lower frame 18 houses an air cylinder 20 having a rod 21 fixedly attached to a connecting bar 22 which in turn is attached to a rod 24. Rod 24 reciprocates within a bore 25 formed in lower frame 18 in response to movement of connection bar 22 that reciprocates in response to the extension of rod 21 in air cylinder 20. Air cylinder 20 is powered in a conventional manner through air inlet line 26. As the rod 21 from air cylinder 20 is extended, the rod 24 slides within the bore 25 and carries with it a drive finger 28 that is attached to the end of rod 24. As drive finger 28 moves inwardly, it urges an ejector 30 inwardly against the outward urging of a spring 32. An adjustable stop screw 34 disposed on the top of ejector 30 and restricts the travel of ejector 30 so as to control its inward extension into a magazine 42. As will be shown in more detail in FIGS. 3 to 6, a former 38 is also carried forward by the forward motion of drive finger 28. Both ejector 30 and former 38 perform functions on the dual in-line electronic component 40 within the magazine 42 as will be described hereinafter. At the furthest reach of the ejector 30, the component 40 is transferred to a position between a pair of picker fingers 44 for subsequent movement and insertion into a circuit board 60.

The picker assembly includes the pair of spread-apart picker fingers 44 that are pivotably disposed upon a pair of pivot points 46. Pivot points 46 serve as a fulcrum on the plane parallel to the direction of movement of the fingers so that divergence on one side of the pivot point 46 will cause convergence of the fingers 44 on the other side so as to enable the fingers 44 to grasp the component 40. Convergence of the gripping ends of the fingers 44 is accomplished by an outward thrust of rod 48 disposed in an air cylinder 50 which causes a flexible plate 52 to close the picker fingers 44 since these fingers 44 swing about the pivot points 46. A pusher 54 is centrally disposed between the picker fingers 44 and is arranged to move upon extension of rod 56 in response to actuation from air cylinder 58. Prior to closing picker fingers 44 and upon such extension, the pusher 54 will enter the mouth of magazine 42 and form a stop for the component 40 so that it will be shaped by former 38 and then held between the ejector 30 and pusher 54. Movement of the component between the magazine 42 and the picker fingers 44 will be described later with reference to FIGS. 3 to 6.

After a component has been transferred from magazine 42 to picker fingers 44, the picker assembly 12 will be moved from a position in alignment with transfer unit 1 to a position normal to the circuit board 60. Circuit board 60 is disposed over an appropriate opening within a table 62 and held by clamps 64 as is well known in the art and shown in the U.S. Pat. No. 4,080,730 to Woodman issued on Mar. 28, 1978. The picker assembly 12 and the associated air cylinders 50 and 58 are mounted upon a pivot housing bracket 66 which is rotatably disposed in bearing supports 68 and 70. Bearing supports 68 and 70 are attached to a pivot housing drive slide 72 by means of screws 71. The downward movement of the pivot housing drive slide 72 is caused by the extension of rod 74 attached to link 76. Such movement initiates an orbital motion for picker assembly 12. Motion on one side of pivot housing drive slide 72 is controlled by roller 78 moving within cam track 79 and on the other side is limited by shaft 80. If torsion presents a problem two rollers may be seated within the track 79. Shaft 80 is fixedly disposed within supports 77 and 81, each of which are attached to the conventional insertion device. The pivot housing drive slide 72 reciprocates in response to rod 74 powered by an air cylinder 75 shown in FIG. 2. Upward and downward limits are placed upon the movement of pivot housing drive slide 72 by limit screws 150 that are mounted in brackets 81 and 77 respectively. Downward motion of rod 74 causes bearing supports 68 and 70 to be shifted downwardly carrying with them arm 82 which has a roller 83 disposed within a cam track 84 to direct the path of movement of the picker 12.

As shown in the dotted lines, when the pivot housing drive slide 72 has reached its lower position (as indicated by roller 83 disposed within cam track 84) the picker assembly 12 is displaced from a plane parallel to circuit board 60 to a position normal to it. In that way, the leads 40a of the dual in-line component 40 are disposed normal to the circuit board 60 so as to be insertable within the holes formed therein.

The leads 40a of the component 40 must be aligned with appropriate holes in the circuit board 60 for proper insertion. Position of the picker unit 12 on one horizontal axis is controlled by loosening screws 71 on bearing supports 68 and 70 and manually shifting bearing supports 68 and 70 on brackets 151 and 152. Thereafter, screws 71 are tightened to fixedly dispose picker 12 in the predetermined position relative to the holes in the circuit board 60. Position of the picker unit 12 in the other axis is adjusted by means of a screw (not shown) disposed in bearing support 70 which urges pivot housing bracket 66 against the action of a spring (not shown) disposed within bearing support 68. Upon loosening the screw disposed in bearing support 70, the spring in bearing support 68 will urge the return of pivot housing bracket 66.

In the lowermost position, the ends of the picker fingers 44 will nearly engage the circuit board 60, causing the leads 40a of the component held therein to enter the holes of circuit board 60. At the same time, the picker fingers 44 will release their grip upon the component 40 (by a retraction of rod 48) and pusher 54 will force the leads through the holes in the circuit board 60. The ends beneath the board will be clinched by conventional clinchers 61 (shown in FIG. 2) such as described in the U.S. Pat. Nos. to Lambert, 3,591,046, issued July 6, 1971 or Allen et al, 3,550,238, issued Dec. 29, 1970.

As different components are to be inserted in the circuit board 60, the transfer units 1 are rotated on hub 3 about shaft 2. The transfer units 1 rotate back and forth between the picker 12 and the drive finger 28 in response to commands eminating from a data processing system. The limit of the motion is established by stop 4 which is attached to the body of the conventional inserter and another stop at the other end of the travel (not shown). Individual components slide from the individual sticks 16.

Referring now to FIG. 2, stick 16 containing electronic components is disposed between two struts 14 which are attached to support 5 by radial wall 47. Stick 16 is held in place by spring clips 17 and is urged forward by leaf springs 89 and 90 to hold the stick 16 substantially vertical. Struts 14 carry transfer units 1 over lower frame 18 and in front of picker 12 so as to present a predetermined electronic component for insertion into a circuit board 60. Lower frame 18 is fixedly attached to the bracket 67 and serves as the support for rod 24 and drive finger 28, as described previously. Movement of the transfer units 1 between drive finger 28 and picker 12 is accomplished by rotation of pinion 9 (driven by servo motor 11). Transfer units 1 rotate around shaft 2 which, in turn, is held by clamps 85 and 87.

A component is transferred from stick 16 through transfer unit 1 to picker 12 (as shown in greater detail in FIGS. 3 to 6). Pusher 54 enters the transfer unit 1 and forms a stop for and then engages one side of the component while at the same time former 38 is urged by ejector 30 which urges the component against the pusher 54 which causes the component leads to be formed. The pressure in air cylinder 58 is controlled so that the urging of the ejector 30 does not overcome the pressure in the air cylinder 58 until the forming motion is complete. At that time the pusher 54 is forced back by the urging of ejector 30. Retraction of pusher 54 is accomplished when stop screw 34 contacts transfer unit 1 and positions the component between the picker fingers 44 which then grasp the component for insertion into the board 60. To grasp the component, the fingers 44 are closed by actuation of air cylinder 50 which extends rod 48 and bends flexible plate 52 causing fingers 44 to pivot about points 46. Air cylinder 75 is then pressurized to cause rod 74 to extend thereby forcing pivot housing drive slide 72 downwardly on shaft 80. Air cylinder 75 is fixedly attached to bracket 67 by means of bracket 65. Upon a downward stroke of piston rod 74, pivot housing bracket 66 is carried downwardly by bearing supports 68 and 70 which are attached to pivot housing drive slide 72. At the same time, arm 82 with roller 83 moves in cam track 84 so that picker assembly 12 swings in an elliptical path to the circuit board 60. Air cylinder 58 is then actuated while simultaneously rod 48 is retracted thereby opening fingers 44 and extending pusher 54. Pusher 54 will insert component leads 40a into the board, and maintain pressure on component 40. Clinching will secure the components to the board and cylinder 58 will retract the pusher while rod 74 is retracted to pull picker 12 to a position in front of transfer unit 1.

Referring now to FIG. 3, components 40 are disposed within a stick 16 which contains them prior to insertion. The stick is generally U-shaped and is constructed so that the components 40 are free to slide but will not become disoriented during shipment or movement. The stick 16 rests upon shoulders 88 which form the tops of the side walls of the magazine 42. The leaf spring 90 urges the inner surface of the stick against a nub 92, the nub 92 being formed as an integral part of a plate 94.

The ejector 30 is formed of an inner and an outer segment 30" and 30' respectively, and is slidably disposed with a U-shaped former 38. A ball fitted within a cavity 102 of ejector 30' fits within a mating hole (not shown in this Figure) disposed in former 38 so as to carry former 38 forward with the urging of drive finger 28 on ejector 30'. A flange 39 is disposed on the outer end of former 38 and at a time when flange 39 contacts the end of the transfer unit 1, the ball slips through the hole in the former 38 and into a mating cavity 104, thereby separating former 38 from the ejector 30'. During this motion, the outer segment 30' of the ejector contacts the inner segment 30" to urge it forward. The former 38 will shape the leads 40a of the component within the magazine 42, as will be described with reference to subsequent Figures.

The component 40 is disposed within the magazine 42 and rests upon floor 106 which is fitted so that the height of magazine 42 allows only one component at a time to fall into it. Floor 106 is movable rearwardly on sub-floor 114 attached to block 120 when engaged by pusher 54. Motion of floor 106 is maintained in a straight line by sliding within inner segment 30" and sub-floor 114 and is limited in its rearward travel by boss 108 being stopped by the end of slot 110. Floor 106 is urged toward picker fingers 44 by spring 112 that is seated within a bore 116.

As drive finger 28 urges the outer segment 30' of the ejector against the inner segment 30", the two elements will remain together and carry forward former 38 into the magazine 42 to shape the leads against the urging of the pusher 54 that is disposed therein.

Further travel of ejector 30', 30" will cause the lead end of ejector 30" to force component 40 from the magazine 42, against the urging of pusher 54. During this travel, the leads 40a are guided by slots (not shown in this Figure) in the side walls of magazine 42 and the component 40 is held by the ejector 30" and pusher 54. Spring clip 200 limits vertical displacement of the component. When set screw 34 contacts transfer unit 1, the component 40 is positioned for grasping by the fingers 44.

As drive finger 28 is withdrawn, spring 32 urges the outer segment 30' away from magazine 42. The ball will slip from cavity 104 through the hole in former 38 and rest in cavity 102, locking outer segment 30' to former 38. Further urging by spring 32 moves the outer segment 30' and former 38 until bosses on former 38 are stopped by nubs attached to block 120 (not shown in this Figure, but located in line with nub 101). Spring 100 attached to outer segment 30' draws inner segment 30" from the magazine until it is stopped by nub 101 attached to block 120. In this position another electronic component 40 can fall upon floor 106. The component that fell had ridden on the top of the inner segment 30" as it was moving into and out of the magazine 42. Withdrawal of drive finger 28 is accomplished by movement of rod 24 within lower frame 18 under the urging of connecting bar 22 and its fixed relationship with air cylinder 20. One end of spring 32 is seated within bore 118 that is disposed in block 120 and urges outwardly the outer segment 30' of the ejector. The other end of spring 32 is disposed upon a protuberance 122 seated on a flange 31 so that it will not disengage from ejector 30'.

As shown in FIGS. 4 to 6, each electronic component 40 falls into magazine 42 formed by side walls 124 of transfer unit 1. The electrical leads 40a have the same general configuration as the side walls of the magazine 42 but are further shaped and oriented by former 38 which slides with outer segment 30' of the ejector 30. The component 40 rests upon the floor 106. As the drive finger 28 moves towards magazine 42, it will engage ejector 30'. Inward travel of the ejector can be limited by adjustment of set screw 34 at the distal end thereof. As clearly indicated in FIG. 4, a ball 111 disposed in cavity 102 will enter hole 103 in former 38 so as to temporarily lock former 38 with ejector 30'. Former 38 will continue its inward movement until flange 39 engages the end of side wall 124 whereby it will stop and ball 111 will slip through hole 103 into a cavity 104. During this motion the lead edge of former 38 engages the leads 40a of the component and urges component 40 against pusher 54. When pusher 54 stops the motion of component 40, the leads 40a will be urged toward the side walls of the magazine 42 to shape them for subsequent insertion. At the same time, the lead end of the ejector 30'' engages the component 40 and forces it against the pusher 54. This causes a pressure build-up in the ejector air cylinder which actuates an air release in the pusher cylinder. Ejector 30'' continues its extension from the magazine and overcomes any resistance from pusher 54 by a pressure differential in the respective air cylinders so that the component 40 can enter between picker fingers 44 where they will engage the lead-in wires 40a. Extension of ejector 30'' also prevents additional components from falling as the transfer is made from the magazine to the picker fingers 44 since the lowermost component will ride on top of the ejector 30'' as it is extending. Upon retraction of the ejector 30, the next component in line will have slid on top of inner segment 30'' and have fallen into the magazine 42 for transfer. In the withdrawal of ejector 30', 30'', a pin 113 disposed on the side of ejector 30' engages the end of a slot 115 to seat ball 111 in cavity 102 which carries former 38 back to begin the cycle anew.

When a four pin dual in-line component is to be inserted with the equipment, the floor 106 and sub-floor 114 is removed and a different sub-floor is attached to the transfer unit 1 and also removed is the ejector 30'' and former 38.

The substituted sub-floor and substituted ejector 30'' are of a height so that only one component 40 can slide therein. A new ejector of the same height as magazine 42 will slide beneath the next component 40 in line above the magazine 42.

It is apparent that modification and changes can be made within the spirit and scope of the present invention, but it is our intention only to be limited to the following claims.

We claim:

1. A machine for inserting electronic components, said components having a body and dual in-line parallel leads extending from the sides thereof, said machine comprising:
   a picker means for inserting said components;
   at least one transfer unit with a magazine having side walls formed therein;
   means movably supporting said at least one transfer unit for movement with respect to said picker means;
   means for retaining a component supply movable with said transfer unit, said component supply holding said components in a predetermined orientation, said retaining means being arranged to dispose said components supply above said magazine whereby said components can drop, one at a time, into said magazine;
   former means and ejector means disposed in said transfer unit, said former means being arranged to urge the leads of said component toward the side walls to shape them, said ejector means being arranged to engage one side of the body of the component for transfer from the magazine; and
   said picker means including a pusher, said pusher being arranged to engage the other side of the body of the component whereby it can be disposed between said ejector and said pusher for transfer from said magazine into said picker.

2. The machine according to claim 1 further including drive means arranged to urge said ejector means through said magazine.

3. The machine according to claim 1 wherein said ejector means is split into two segments, spaced from each other and drawn together by a tensioning means, said former being disposed about said ejector means and arranged to move when said ejector means moves and being carried by said ejector means until said former shapes said leads said ejector further being arranged so as to engage said component for transfer from said magazine.

4. The machine according to claim 1 wherein the component supply is disposed upon the top of said magazine and is aligned with said side walls whereby said components can drop from said supply into said magazine, said ejector means being arranged to slide immediately beneath said component supply whereby a component disposed in said supply will ride on top of said ejector as said ejector is passing into said magazine and whereby when said ejector is retracted from said magazine one of the components will fall into said magazine.

5. The machine according to claim 4 wherein there are a plurality of transfer units and corresponding retaining means, each transfer unit being arranged with an associated retaining means, said transfer units being arranged to index into operative relationship with said picker means whereby a multiplicity of different electronic components can be inserted with said machine.

6. The machine according to claim 5 wherein the transfer units are radially arranged about a hub, said units being rotatable in response to a motor means whereby one of said tranfer means can be indexed into a position operatively associated with said picker.

7. A machine for inserting electronic components, said components having a body and dual in-line parallel leads extending therefrom, said machine comprising:
   a plurality of radially arranged transfer units, each transfer unit having individual means for retaining supplies of components;
   means for indexing individual transfer units with respective retaining means into a predetermined position in front of a picker means, said picker means including a pusher means associated therewith and arranged to engage one side of a component;
   an ejector means in each of said transfer units arranged to move said component against said pusher means and move said component from said transfer unit to said picker means; and
   means to move said picker means from a position in front of the indexed transfer unit to a position over a table for insertion of said component into a circuit board.

8. The machine according to claim 7 wherein said picker means moves in a eliptical path from said transfer means to said table, said path being controlled by a linkage connected at one end to said picker means and at the other end to a cam disposed in a cam track, said cam track being shaped so that upon actuation, the picker means will swing down and then extend it to a position over said table.

9. The machine according to claim 7 wherein said picker means includes a pair of fingers spaced from each other and disposed upon a pivot point on a plane parallel to the direction of movement of the fingers so that divergence of the fingers on one side of the point will cause convergence of the fingers on the other side of the pivot point so as to enable the fingers to grasp a component.

10. The machine according to claim 9 further including an air cylinder and a rod, said rod being connected to a flexible plate, said flexible plate being arranged to abut the ends of the fingers and urge them apart.

11. The machine according to claim 7 wherein each transfer unit has a magazine disposed at one end thereof and the retaining means is arranged so that the components drop one at a time into said magazine, said transfer unit further including a former means and said ejector means, said former means being arranged to urge the leads of the components toward the side walls of said magazine so as to shape the leads, said ejector means being arranged to force said components into a picker means past the side walls of said magazine.

12. The machine according to claim 11 wherein said ejector means is split into two segments spaced from each other and drawn together by a tensioning means, said drive means being arranged so as to move said former means into said magazine to shape said components while simultaneously moving the second segment into contact with the first segment whereby said segment, after the former has shaped the component leads, will then travel to urge said component out of said magazine and into said picker means in a predetermined shape and orientation, and upon retraction of said drive means, said first section of said ejector means will retreat to the rest position while said second section will retreat further together with said former means.

13. The machine according to claim 11 wherein the component supply is disposed upon the top of said magazine and is aligned with said side walls whereby said components can drop from said supply into said magazine, said ejector means being arranged to slide immediately beneath said component supply whereby a component disposed in said supply will ride on top of said ejector as said ejector is passing into said magazine and whereby when said ejector is retracted from said magazine one of the components will fall into said magazine.

14. The machine according to claim 7 wherein said electronic component has two or four parallel leads extending therefrom.

* * * * *